United States Patent
Kadomura et al.

[11] Patent Number: 5,968,273
[45] Date of Patent: Oct. 19, 1999

[54] WAFER STAGE FOR MANUFACTURING A SEMICONDUCTOR DEVICE

[75] Inventors: Shingo Kadomura; Tomohide Jozaki; Shinsuke Hirano; Kinya Miyashita; Yoshiaki Tatsumi; Seiichirou Miyata, all of Kanagawa, Japan

[73] Assignee: Sony Corporation, Tokyo, Japan

[21] Appl. No.: 08/910,329

[22] Filed: Aug. 13, 1997

[30] Foreign Application Priority Data

Aug. 16, 1996 [JP] Japan .................................. 8-216225

[51] Int. Cl.$^6$ .................................................. C23C 16/00
[52] U.S. Cl. ...................... 118/715; 118/725; 118/723 E
[58] Field of Search .................... 118/715, 725, 118/723 E

[56] References Cited

U.S. PATENT DOCUMENTS 5,851,298  12/1998  Ishii ........................................ 118/728
5,883,778  3/1999  Sherstinsky et al. .................... 361/234

Primary Examiner—Bruce Breneman
Assistant Examiner—Erin Fieler
Attorney, Agent, or Firm—Hill & Simpson

[57] ABSTRACT

Disclosed is a wafer stage allowing a plasma process under a heating condition at a high temperature, particularly, 400° C. or more using the improved electrostatically chucking technology with the increased temperature-controllability. The wafer stage includes an electrostatic chuck and a temperature adjusting jacket disposed under said electrostatic chuck. The electrostatic chuck includes: a dielectric member made from an insulating material; an electrode formed of a brazing layer, which is disposed on the underside of said dielectric member for fixing said dielectric member; an aluminum nitride plate disposed on the underside of said electrode, to which said dielectric member is fixed through said electrode; a heater, disposed on the underside of said aluminum nitride plate, for heating said dielectric member; and a metal plate disposed on the underside of said aluminum nitride plate and also at least on a top or bottom side of said heater. The temperature adjusting jacket is made from a composite aluminum based material prepared by treatment of aluminum or an aluminum alloy with inorganic fibers under a high pressure, and includes a temperature adjusting means.

2 Claims, 4 Drawing Sheets

WAFER STAGE FOR MANUFACTURING A SEMICONDUCTOR DEVICE

BACKGROUND OF THE INVENTION

The present invention relates to a wafer stage mainly used for manufacturing a semiconductor device, and particularly to a wafer stage suitably used for a plasma process performed in a state in which a wafer is heated at a high temperature of 400° C. or more.

In the field of manufacture of semiconductor devices, there are known a variety of plasma processes for wafers, such as plasma etching and plasma CVD.

In such a plasma process, particularly, in plasma etching, there is a tendency to adopt low temperature etching for increasing a processing accuracy. As is apparent from this viewpoint, the temperature control for wafers is being regarded important.

In recent years, with the advance of multi-level interconnection technology for LSIs, there has been strong demands toward development for a new interconnection material such as copper for reducing the resistance of the interconnection and toward adoption of high density plasma CVD for gap filling technology. As a result, a plasma process performed at a high temperature is being regarded important, in addition to the above-described plasma process performed at a low temperature.

In such a plasma process performed at a high temperature, however, a wafer receives a large heat input due to generation of plasma upon ion bombardment at an etching step or upon irradiation of high density plasma at a gap filling step by CVD or a barrier metal formation step by CVD. Consequently, the temperature of the wafer is possibly increased about 40 to 100° C. or more as compared with that before generation of plasma.

Accordingly, in the plasma process performed at a high temperature in which a wafer is heated by a wafer stage holding the wafer, it becomes important to suppress the effect of heat input due to generation of plasma on the wafer and to control the temperature of the wafer at a setting value.

In the related art, however, the temperature control for a wafer has not been sufficiently performed at a high temperature, and from the practical standpoint, the process condition has been set such that the temperature of a wafer stage is previously set at a lower value in consideration of the above-described temperature rise caused during processing.

The reasons why it is difficult to control the temperature of a wafer in a plasma process performed at a high temperature are as follows:

(1) The heating of a wafer by a wafer stage is generally performed using a heater provided in the wafer stage; however, a temperature rise of the wafer caused by heat input due to generation of plasma cannot be suppressed only by heating using the heater.

(2) In the case using a wafer stage including an electrostatic chuck for attracting a wafer and a metal made jacket for adjusting the temperature of the electrostatic chuck, although the improvement in the degree of bonding between a wafer and a wafer stage has been examined, an electrostatically chucking technology for improving the temperature-controllability for the wafer has been not established.

In particular, with respect to the item (2), at a high temperature, an organic material based film made from polyimide or the like cannot be used as a dielectric member for an electrostatic chuck, and a ceramic material is difficult to use because of the variable bulk resistivity thereof. Also, a ceramic material presents another problem in terms of the joint with a metal material in an electrostatic chuck or a metal made jacket.

In general, a ceramic material has a linear thermal expansion coefficient largely different from that of a metal, and consequently, when such a ceramic material is joined to a metal by thermal spraying or brazing, it tends to be broken in a heating condition due to a difference in linear thermal expansion coefficient therebetween. In particular, when the temperature of a wafer is set at 400° C. or more upon a plasma CVD process, even in the case of using an Al made jacket, since there is a large difference in linear thermal expansion coefficient between an electrostatic chuck and the Al made jacket, it becomes difficult to prevent breakage of the electrostatic chuck and hence to direct join them to each other.

OBJECT AND SUMMARY OF THE INVENTION

An object of the present invention is to provide a wafer stage allowing a plasma process at a high temperature, particularly, 400° C. or more using the improved electrostatically chucking technology with the increased temperature-controllability.

To achieve the above object, according to the present invention, there is provided a wafer stage including an electrostatic chuck and a temperature adjusting jacket disposed on the underside of the electrostatic chuck. The electrostatic chuck includes: a dielectric member made from an insulating material; an electrode formed of a brazing layer, which is disposed on the underside of the dielectric member for fixing the dielectric member; an aluminum nitride plate disposed on the underside of the electrode, to which the dielectric member is fixed through the electrode; a heater, disposed on the underside of the aluminum nitride plate, for heating the dielectric member; and a metal plate disposed on the underside of the aluminum nitride plate and also at least on a top or bottom side of the heater. The temperature adjusting jacket is made from a composite aluminum based material prepared by treatment of aluminum or an aluminum alloy with inorganic fibers under a high pressure, and it includes a temperature adjusting means.

According to this wafer stage, the heater is integrated with the electrostatic chuck, and accordingly, the thermal energy generated by the heater can be readily transferred to the dielectric member through the electrode, and thereby the wafer held on the dielectric member can be readily heated.

Since the electrode of the electrostatic chuck is formed of a brazing layer for fixing the dielectric member, it can be positively joined to the dielectric member and also it can be thinned. Further, since the electrode is made from a brazing material, that is, a metal or an alloy having a high thermal conductivity, the heat generated by the heater can be more readily transferred to the dielectric member through the electrode.

Since the aluminum nitride plate having a high thermal conductivity of 0.235 (cal/cm)×sec×° C. is provided between the electrode and the heater, the heat generated by the heater can be readily transferred to the electrode through the aluminum nitride plate.

Since the metal plate is disposed at least on a top or bottom side of the heater, even when the electrode formed of the brazing layer is thinned, the mechanical strength of the entire electrostatic chuck can be sufficiently kept by the presence of the metal plate. In the case where the metal plate is disposed on the top side of the heater, it serves as a heat transfer plate for readily transferring the heat generated by the heater to the aluminum nitride plate side. In the case where the metal plate is disposed on the bottom side of the heater, it serves as a heat transfer plate for transferring a heating or cooling energy from the temperature adjusting jacket disposed on the underside of the electrostatic chuck to the heater side.

According to this wafer stage, the temperature adjusting jacket including the temperature adjusting means is disposed on the underside of the electrostatic chuck having such a configuration. Consequently, in addition to positive heating of the wafer by the heater provided in the electrostatic chuck, temperature adjustment for the wafer can be performed by the temperature adjusting jacket by way of the electrostatic chuck.

Also, the temperature adjusting jacket is made from a composite aluminum based material prepared by treatment of aluminum or an aluminum alloy with inorganic fibers under a high pressure. The composite aluminum based material has a thermal conductivity close to that of aluminum and a linear thermal expansion coefficient lower than that of aluminum. As a result, when the temperature adjusting jacket is directly joined to the electrostatic chuck, since the linear thermal expansion coefficient of the temperature adjusting jacket is close to that of the dielectric member in the electrostatic chuck, the dielectric member and the like can be prevented from being cracked and/or peeled due to a difference in linear thermal expansion coefficient therebetween.

According to the wafer stage of the present invention, preferably, the electrostatic chuck is integrally joined to the temperature adjusting jacket through a brazing layer. This makes it possible to achieve stress relief between the electrostatic chuck and the temperature adjusting jacket, and to more readily transfer a heating or cooling energy from the temperature adjusting jacket to the electrostatic chuck side.

BRIEF DESCRIPTION OF THE DRAWINGS

The above and other objects, features and advantages of the present invention will be apparent from the following detailed description of the preferred embodiment of the invention in conjunction with the accompanying drawings, in which.

DETAILED DESCRIPTION OF PREFERRED EMBODIMENT

Figure 1:
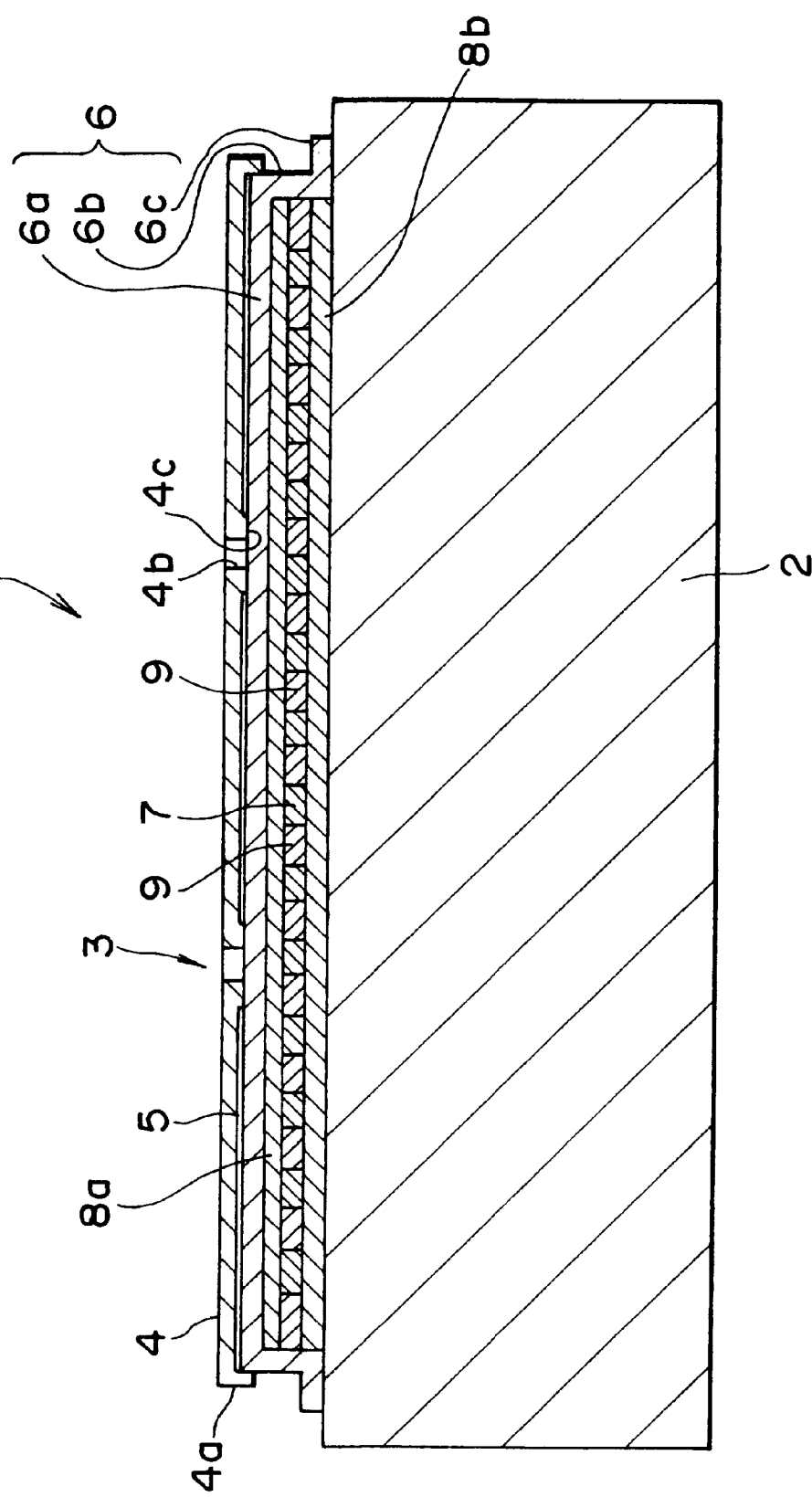
FIG. 1 is a view showing a schematic configuration of a wafer stage of the present invention, with only an electrostatic chuck being broken away.

Referring to FIG. 1, there is shown one embodiment of a wafer stage according to the present invention. In this figure, reference numeral 1 indicates a wafer stage including a temperature adjusting jacket 2 and an electrostatic chuck 3 fixedly mounted on the temperature adjusting jacket 2.

The temperature adjusting jacket 2, including a temperature adjusting means (not shown) described later, is adapted to transfer a heating or cooling thermal energy from the temperature adjusting means to the electrostatic chuck 3 mounted thereon. The temperature adjusting jacket 2 is made from a composite aluminum based material prepared by treatment of aluminum or an aluminum alloy with inorganic fibers of alumina, silicon carbide, potassium titanate, aluminum borate or the like under a high pressure. In this embodiment, there is used a composite aluminum based material sold by A. M. Technology under the trade name "FRM-Al".

The material "FRM-Al" is prepared by forming aluminum layers on both sides of a FRM layer composed of alumina fibers impregnated with aluminum. With respect to the material "FRM-Al", the linear thermal expansion coefficient at 400° C. as a whole is $13.6 \times 10^{-6}/°$ C., which is about half the linear thermal expansion coefficient at 400° C. ($26 \times 10^{-6}/°$ C.) of aluminum; and the thermal conductivity at 400° C. as a whole is 0.272 (cal/cm)×sec×° C., which is close to the thermal conductivity at 400° C. (0.502 (cal/cm)×sec×° C.) of aluminum.

The electrostatic chuck 3, which is formed in an approximately cylindrical (disk) shape, includes a dielectric member 4 made from an insulating material, an electrode 5 formed of a brazing layer provided on the bottom surface of the dielectric member 4, an aluminum nitride plate 6 disposed on the underside of the electrode 5, a heater 7 disposed on the underside of the aluminum nitride plate 6, and metal plates 8a and 8b disposed on the underside of the aluminum nitride plate 6 and also disposed on top and bottom sides of the heater 7.

The dielectric member 4 is formed from an insulating material having a high thermal conductivity into an approximately disk shape having a thickness of about 0.1 mm. In this embodiment, as the dielectric member 4, there is used a sintered body previously made from aluminum nitride having a thermal conductivity of 0.235 (cal/cm)×sec ×° C. The disk-like portion of the dielectric member 4 has a cylindrical portion 4a extending downward from the side peripheral edge thereof. The disk-like portion also has through-holes 4b from which pusher-pins (not shown) for pushing up a wafer held on the dielectric member 4 as will be described later project upward from the surface of the dielectric member 4. Cylindrical portions 4c, each having a height identical to the layer thickness of the electrode 5, are provided on the bottom surface of the dielectric member 4 at positions around the through-holes 4b for preventing the pusher-pins from being brought in contact with the electrode 5 formed of the brazing layer. In addition, although the dielectric member 4 is made from aluminum nitride in this embodiment, the present invention is not limited thereto. For example, as the dielectric member 4, there may be used a ceramic plate made from sapphire (thermal conductivity: 0.1 (cal/cm)×sec×° C.) or alumina (thermal conductivity: 0.05 (cal/cm)×sec×° C.).

The electrode 5 is formed of a brazing layer for fixing the dielectric member 4 to the aluminum nitride plate 6. That is, a brazing layer having a thickness of about 0.2 mm as the electrode 5 is formed between the aluminum nitride plate 6 and the dielectric member 4. The brazing material is represented by an alloy containing titanium, tin, antimony and magnesium. Since the electrode 5 is provided on the top surface of the aluminum nitride plate 6 and the dielectric member 4, the side ends of the electrode 5 are covered with the cylindrical portion 4 of the dielectric member 4. The electrode 5 is also provided between the top surface of the aluminum nitride plate 6 and the dielectric member 4 in such a manner as not to be brought in contact with the cylindrical portions 4c of the dielectric member 4, so that the pusher-pins passing through the cylindrical portions 4c are not brought in contact with the electrode 5.

The electrode 5 is connected to a high voltage power supply via wiring (not shown in FIG. 1). When the electrode 5 is applied with a DC voltage from the high voltage power supply, the dielectric member 4 exhibits an attracting force. The electrode 5 is also connected to a RF power supply via wiring (not shown in FIG. 1). In the electrostatic chuck 3, the temperature adjusting jacket 2 made from a composite aluminum based material as described above cannot be used as a RF electrode as it is, differently from a metal jacket made from typically aluminum. For this reason, the electrode 5 serves as a RF electrode.

The aluminum nitride plate 6 is composed of a disk portion 6a abutted on the electrode 5, that is, the brazing layer; a cylindrical portion 6b extending downward from the side peripheral edge of the disk portion 6a; and a flange portion 6c extending outward from the lower edge of the cylindrical portion 6b. The aluminum nitride plate 6 has a thickness of about 2 mm as a whole. The aluminum nitride plate 6, which has the high thermal conductivity of 0.235 (cal/cm)×sec×° C. as described above, is allowed to readily effect heat transfer from the heater 7 disposed under the aluminum nitride plate 6 to the electrode 5.

The heater 7 is a thin film which is formed from a heat resisting alloy containing Fe, Cr and Al into a spiral shape (in a plan view) having a thickness of about 0.04 mm and a width of about 2 to 3 mm. The heater 7 is connected to a power supply (not shown) via wiring, and thereby it generates a thermal energy of about 2 kW.

In the heater 7, gaps of the spiral heat pattern are buried with an insulating material 9. Thus the heater 7 is formed of a disk shape in which the heat pattern is reinforced with the insulating material 9. In this embodiment, there is used aluminum nitride as the insulating material 9.

The disk shaped heater 7 buried with the insulating material 7 has the upper surface stuck with the metal plate 8a and the lower surface stuck with metal plate 8b. The heater 7 thus held between the metal plates 8a and 8b is contained, together with the metal plates 8a and 8b, in the cylindrical portion 6b of the aluminum nitride plate 6 without any gap therebetween. As each of the metal plates 8a and 8b, a metal or an alloy having a large thermal conductivity may be used in order to readily transfer the heat generated by the heater 7 to the dielectric member 4 or to readily transfer a heating or cooling thermal energy from the temperature adjusting jacket 2 to the heat 7. In this embodiment, a molybdenum (Mo) plate having a thickness of about 1.5 to 2.0 mm is used as each of the metal plates 8a and 8b.

An insulating film (not shown) formed of an oxide film is provided on the inner surface, that is, on the surface of the heater 7 side of each of the metal plates 8a and 8b for preventing a current from flowing from the heater 7 to each of the metal plates 8a and 8b. The metal plate 8a is joined to the aluminum nitride plate 6 by brazing, and the metal plate 8b is joined to the temperature adjusting jacket 2 by brazing. As the brazing material used for brazing of the metal plates 8a and 8b, there is used an alloy containing titanium, tin, antimony, and magnesium, like the brazing material forming the electrode 5.

As described above, the pusher-pins (not shown) for pushing up a wafer held on the dielectric member 4 are buried in the electrostatic chuck 3, and a pusher-pin moving mechanism (not shown) for moving a wafer upward or downward from the surface of the dielectric member 4 is connected to the pusher-pins.

Figure 2:
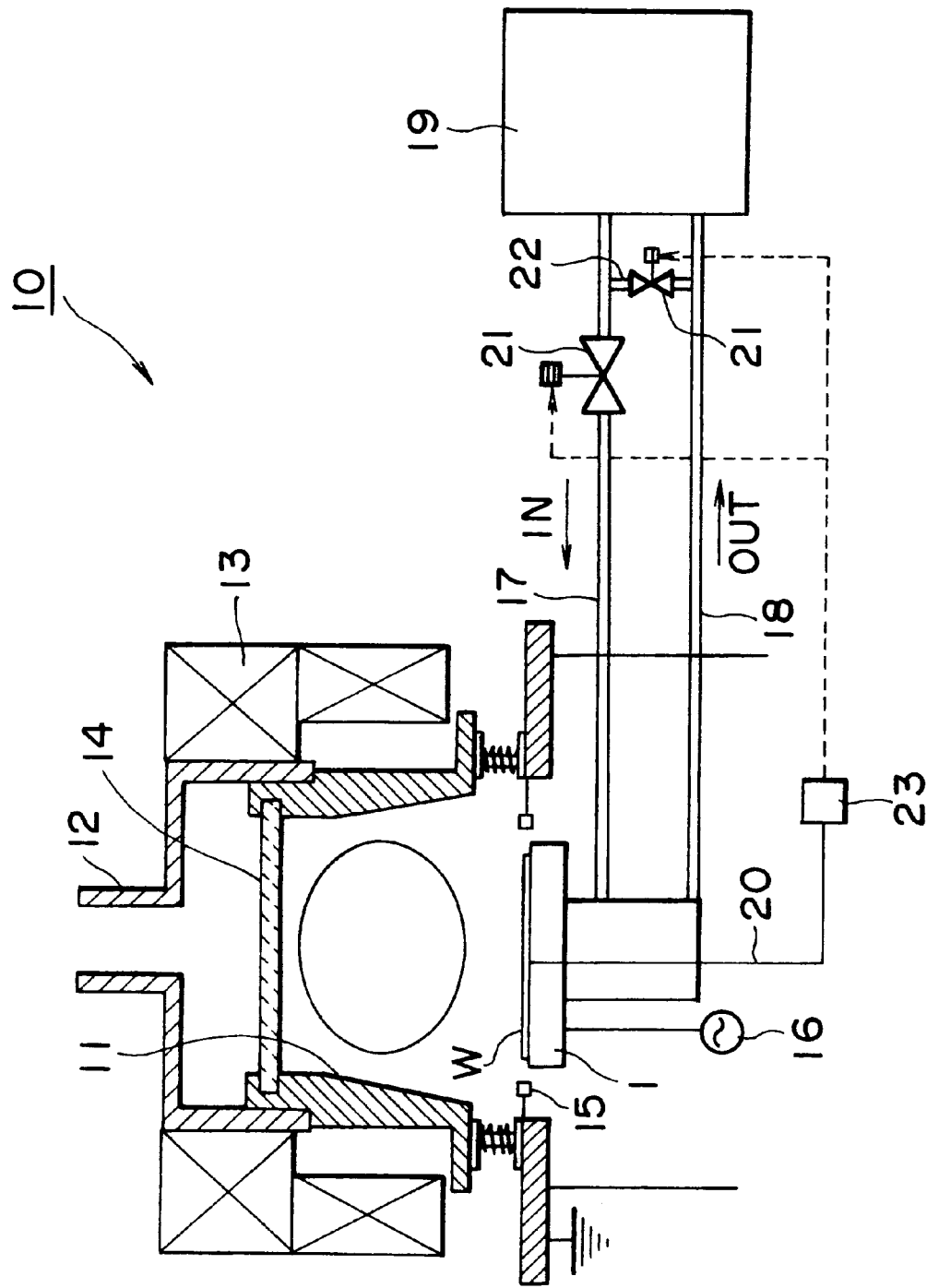
FIG. 2 is a view showing a schematic configuration of a plasma CVD system using the wafer stage shown in FIG. 1.

Next, the operation of the wafer stage 1 will be described with reference to an example in which the wafer stage 1 in this embodiment is used for an ECR (Electron Cyclotron Resonance) type CVD system 10 shown in FIG. 2.

The CVD system 10 includes a microwave guide 12 provided over a chamber 11, a solenoid 13 provided around the microwave guide 12, and a microwave introducing port 14 provided under the microwave guide 12. The wafer stage 1 for fixedly supporting a wafer W as a sample is provided in the chamber 11. A reaction gas such as $O_2$ or $CF_4$ is supplied in the chamber 11 through a gas inlet (not shown) disposed in the vicinity of the microwave introducing port 12, and TEOS (tetraethoxy silane) as a source gas is introduced from a gas inlet ring 15 disposed near the wafer stage 1. The electrode 5 of the wafer stage 1 is connected to a high voltage power supply (not shown) via wiring, and also connected to a RF power supply 16 via wiring.

The temperature adjusting jacket 2 of the wafer stage 1 is connected to a medium supply unit 19 via pipes 17, 18 for supplying a temperature adjusting medium, and is also connected to a fluorescent fiber temperature sensor 20 for measuring the temperature of the wafer W. As the medium supply unit 19, there can be used a chiller for supplying a gas refrigerant kept at a temperature of −100° C. or less such as He gas. In this embodiment, however, there is used a high temperature medium supply unit for supplying a high temperature medium kept at a temperature of 50 to 200° C. such as silicon oil. Specifically, the medium supply unit 19 supplies a high temperature medium to the temperature adjusting jacket 2 of the wafer stage 1 via the pipe 17 and receives the high temperature medium returned from the temperature adjusting jacket 2 via the pipe 18, and further, it heats and cools it at a specific temperature. The circulation of the high temperature medium functions to heat the wafer W fixedly supported on the wafer stage 1 in co-operation with the heater 7 of the electrostatic chuck 3 and to adjust the temperature of the wafer W. The medium supply unit 19, pipes 17 and 18, and the high temperature medium circulated between the medium supply unit 19 and the temperature adjusting jacket 2 constitute the temperature adjusting means of the present invention.

A control valve 21 operable at high temperatures is disposed in the pipe 17 connected to the medium supply unit 19, and a control valve 21 operable at high temperatures is also disposed in a bypass pipe 22 between the pipes 17 and 18.

The heating of the wafer W is generally performed by the heater 7 of the electrostatic chuck 3, although it depends on the setting temperature of the wafer W. On the other hand, the heating by the temperature adjusting jacket 2 through circulation of a high temperature medium from the medium supply unit 19 is rather used for cooling the wafer W heated over the setting temperature by the heater 7 and plasma in order to stabilize the temperature of the wafer W and to cancel the heat input due to generation of plasma.

For example, when the setting temperature of the wafer W in the plasma process is taken as 400° C., the heating condition of the heater 7 is set such that the wafer W is heated at a temperature of about 450 to 500° C., and the temperature of a high temperature medium circulating to the temperature adjusting jacket 2 is set at about 200° C. By such a combination of the heating by the heater 7 and the heating by the temperature adjusting jacket 2, the temperature of the wafer W is controlled at the setting value, 400° C.

Although there occurs a temperature rise of the wafer W thus controlled by the effect of a larger heat input due to generation of plasma, the setting temperature of the wafer W is controlled by adjustment of the temperature or flow rate of the high temperature medium supplied from the medium supply unit 19.

Specifically, to reduce the temperature of the temperature adjusting jacket 2 of the wafer stage 1 lower than that before generation of plasma, that is, to reduce the temperature of the wafer W to the setting value by canceling the heat input due to generation of a plasma, the temperature detected by the fluorescent fiber temperature sensor 20 is supplied to a control unit (PID controller) 23, and the control unit 23 operates to cool the high temperature medium by the medium supply unit 19 at a value predetermined by experiments and calculation on the basis of a difference with the predetermined setting temperature of the wafer W, or to control the opening/closing of the control valves 21 for setting the flow rate of the high temperature medium at a value predetermined by experiments and calculation.

Next, one example in which a plasma CVD process is performed using such a CVD system 10 will be described with reference to FIGS. 3A and 3B.

Figure 3A:
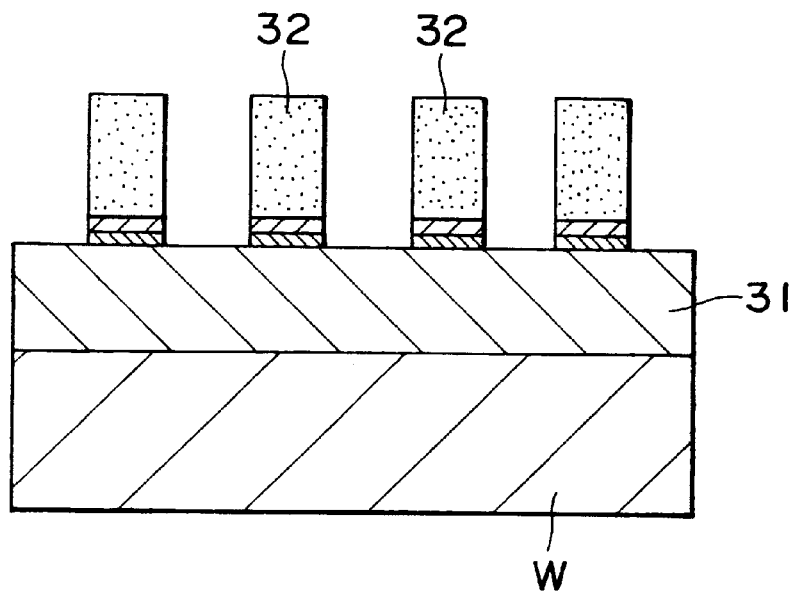
FIGS. 3A and 3B are sectional side views of essential portions of a wafer, sequentially illustrating steps of processing the wafer by a plasma CVD process using the system shown in FIG. 2.

In this example, as shown in FIG. 3A, a SiOF film for gap filling was formed on a plurality of Al interconnections 32 formed on a wafer W through a $SiO_2$ film 31.

First, the wafer W formed in the state shown in FIG. 3A was set on the wafer stage 1, and was adjustedly heated at a setting temperature required for CVD, 400° C.

The heating adjustment for the wafer W was performed by heating the wafer W to a temperature higher than 400° C. by the heater 7 of the electrostatic chuck 3, and simultaneously circulating silicon oil (high temperature medium) adjustedly heated at 200° C. from the medium supply unit 19 to the temperature adjusting jacket 2 for canceling the thermal energy of the wafer W in excess of 400° C., thereby adjusting the temperature of the wafer W at the setting value, 400° C.

The wafer W thus kept in the setting temperature was subjected to plasma CVD in the following condition:

source gas: $TEOS/O_2/CF_4$, 10/50/30 sccm pressure: 0.5 Pa source power: 2500 W RF bias: 500 W wafer stage temperature: 400° C.

In this plasma CVD, the wafer W receives a large heat input due to generation of plasma. To cancel such a heat input, a temperature detected by the fluorescent fiber temperature sensor 20 is supplied to the control unit (PID controller) 23, and the control unit 23 operates to adjust the temperature or flow rate of the high temperature medium on the basis of the detected value. Thus, the thermal energy supplied to the temperature adjusting jacket 2 is reduced, to cancel the heat inputted to the wafer W due to generation of plasma, thereby keeping the temperature of the wafer W at the setting value.

Figure 3B:
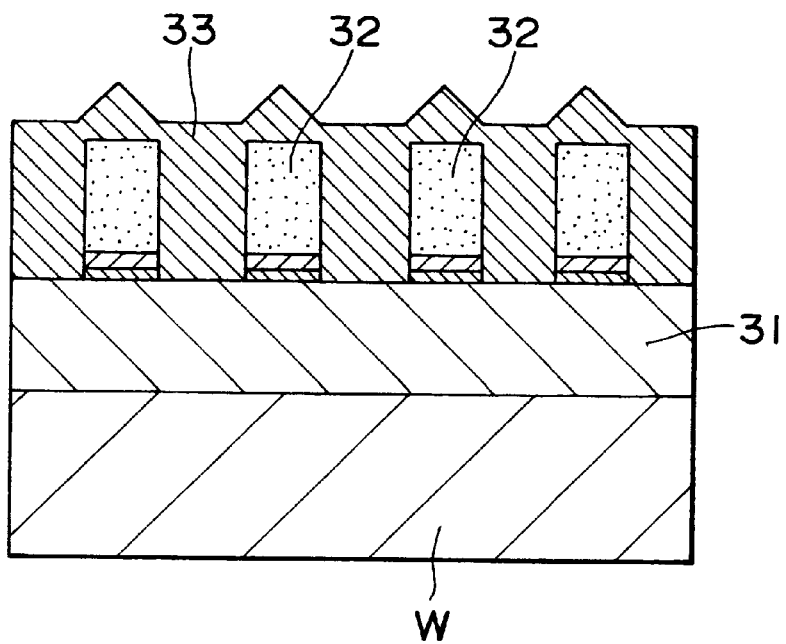

In accordance with the plasma CVD performed in such a condition, a good SiOF film 33 having a high density was formed as shown in FIG. 3B, to thereby effect desirable filling of gaps for the Al interconnections 32.

According to the related art, even in the case of using an electrostatic chuck for fixedly supporting the wafer W, the electrostatic chuck is not joined to a temperature adjusting jacket or cooling of the entire wafer stage by the temperature adjusting jacket (that is, relative cooling to heating by the heater) is not carried out, and consequently, heating by the wafer stage for the wafer W is adjusted such that the wafer W is heated at about 200° C. in consideration of a temperature rise caused by heat input due to generation of plasma, and eventually the film formation for the wafer W is performed at a high temperature. On the contrary, in this example using the wafer stage 1, the plasma CVD process was performed in the state that the temperature of the wafer W was initially adjusted at the setting value (400° C.). In such a temperature control system using the wafer stage 1, the maximum temperature increment ΔT of the wafer W in a period before and after generation of plasma was allowed to be suppressed at about 20° C.

Specifically, in the example in which plasma CVD is performed using the wafer stage 1, there can be avoided such an inconvenience that in the related art film formation, since the temperature of the wafer W is previously set at a lower value, the film formation temperature is changed with an elapse of time and thereby the film obtained differs in film quality in the thickness direction.

Next, another example in which plasma CVD process is performed using the CVD system 10 will be described with reference to FIGS. 4A and 4B.

Figure 4A:
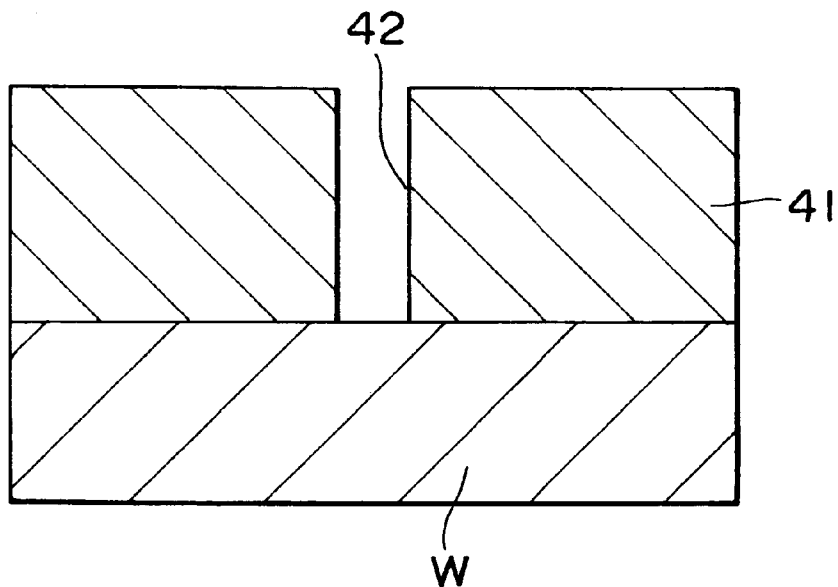
FIGS. 4A and 4B are sectional side views of essential portions of a wafer, sequentially illustrating steps of processing the wafer by another plasma CVD process using the system shown in FIG. 2.

In this example, as shown in FIG. 4A, a contact hole 42 having an aspect ratio of 4 was formed in the $SiO_2$ film 41 formed on a wafer W and a Ti film and a TiN film were formed in the contact hole 42. Additionally, in this example, $TiCl_4$ was introduced through the gas inlet ring 15 and also $H_2$ and $N_2$ were introduced through a gas inlet (not shown) formed at a portion near the microwave introducing port 14.

First, the wafer W formed in the state shown in FIG. 4A was set on the wafer stage 1 as in the previous example, and was adjustedly heated at a setting temperature required for plasma CVD, 500° C.

The heating adjustment for the wafer W was performed, as described above, by heating the wafer W to a temperature higher than 500° C. by the heater 7 of the electrostatic chuck 3, and simultaneously circulating silicon oil (high temperature medium) adjustedly heated at 200° C. from the medium supply unit 19 to the temperature adjusting jacket 2 for canceling the thermal energy of the wafer W in excess of 500° C., thereby adjusting the temperature of the wafer W at the setting temperature, 500° C.

Figure 4B:
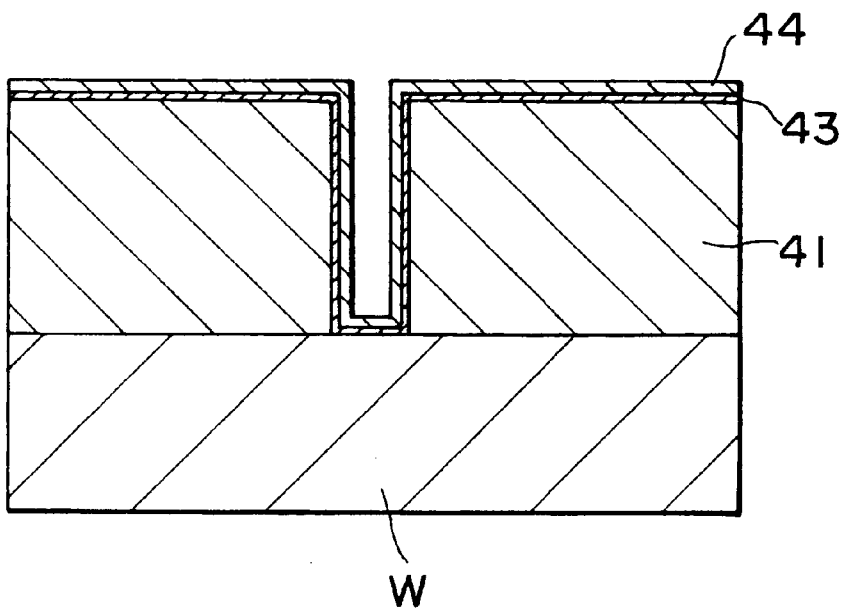

The wafer W thus kept in the setting temperature was subjected to plasma CVD for forming a Ti film 43 as shown in FIG. 4B, in the following condition:

source gas: $TiCl_4/H_2/Ar$, 3/100/100 sccm pressure: 0.5 Pa source power: 2500 W RF bias: 0 W wafer stage temperature: 500° C.

Subsequently, the wafer W was subjected to plasma CVD for forming a TiN film 44 as shown in FIG. 4B, in the following condition:

source gas: $TiCl_4/H_2/N_2/Ar$, 15/100/5/100 sccm pressure: 0.5 Pa source power: 2500 W RF bias: 0 W wafer stage temperature: 500° C.

In this plasma CVD, the wafer W receives a large heat input due to generation of plasma. To cancel such a heat input, as in the previous example, a temperature detected by the fluorescent fiber temperature sensor 20 is supplied to the control unit (PID controller) 23, and the control unit 23 operates to adjust the temperature or flow rate of the high temperature medium on the basis of the detected value. The thermal energy supplied to the temperature adjusting jacket 2 is thus reduced, to cancel the heat inputted to the wafer W due to generation of plasma, thereby keeping the temperature of the wafer W at the setting value.

In accordance with the plasma CVD performed in the above conditions, a barrier metal composed of the Ti film 43 and TiN film 44 each having a high density and a low concentration of chlorine was formed as shown in FIG. 4B.

According to the related art, even in the case of using an electrostatic chuck for fixedly supporting the wafer W, the electrostatic chuck is not joined to a temperature adjusting jacket or cooling of the entire wafer stage by the temperature adjusting jacket (that is, relative cooling to heating by the heater) is not carried out, and consequently, heating by the wafer stage for the wafer W is adjusted such that the wafer W is heated at about 300° C. in consideration of a temperature rise caused by heat input due to generation of plasma, and eventually the film formation for the wafer W is performed at a high temperature. On the contrary, in this example using the wafer stage 1, the plasma CVD process was performed in the state that the temperature of the wafer W was initially adjusted at the setting value (500° C.). In such a temperature control system using the wafer stage 1, the maximum temperature increment ΔT of the wafer W in a period before and after generation of plasma was allowed to be suppressed at about 20° C.

Specifically, in the example in which plasma CVD is performed using the wafer stage 1, there can be avoided such an inconvenience that in the related art film formation, since the temperature of the wafer W is previously set at a lower value, the film formation temperature is changed with an elapse of time and thereby the film obtained differs in film quality in the thickness direction. As a result, in this example, it becomes possible to form a barrier metal having a good film quality in which the concentration of chlorine is 0.2% or less.

As described above, the wafer stage 1 shown in FIG. 1 is particularly advantageous for the case where the wafer W is set at a high temperature. Concretely, by heating the wafer W at a temperature more than the setting value by the heater 7 integrated with the electrostatic chuck 3 and simultaneously suppressing the degree of heating for the wafer W by canceling, using the temperature adjusting jacket 2, the thermal energy given by the heater 7 in excess of the setting temperature, it becomes possible to stably adjust the temperature of the wafer W at the setting value. Even if the wafer W receives heat input due to generation of plasma, the heat input can be canceled by adjusting the temperature of the heater 7 or adjusting the temperature adjusting means provided in the temperature adjusting jacket 2, so that the temperature of the wafer W can be prevented from being largely changed during plasma processing.

In the electrostatic chuck 3, each of the metal plates 8a and 8b is made from molybdenum having a linear thermal expansion coefficient of $5.7 \times 10^{-6}/°$ C. which is close to the linear thermal expansion coefficient ($5.1 \times 10^{-6}/°$ C.) of the aluminum nitride plate 6 and also having a thermal conductivity of 0.370 (cal/cm)×sec×° C. Accordingly, even if the wafer stage 1 is applied with a thermal stress due to temperature changes, the aluminum nitride plate 6 and/or the dielectric member 4 disposed thereon can be prevented from being cracked and/or peeled due to such a thermal stress.

The temperature adjusting jacket 2 is made from a composite aluminum based material having a thermal conductivity close to that of aluminum and also having a linear thermal expansion coefficient lower than that of aluminum. Accordingly, in the case where the temperature adjusting jacket 2 is directly joined to the electrostatic chuck 3, since the linear thermal expansion coefficient of the temperature adjusting jacket 2 is close to that of each of the dielectric member 4 and the aluminum nitride plate 6 in the electrostatic chuck 3, the dielectric member 4 and the like can be prevented from being cracked and/or peeled due to a difference in linear thermal expansion coefficient therebetween. Consequently, although it was difficult to use the related art wafer stage in a plasma process at a high temperature of 400° C. or more, the wafer stage 1 can withstand such a severe temperature condition of the plasma process and also it allows such a high temperature plasma process to be performed under a stable temperature condition.

Further, in the wafer stage 1, the joints between the temperature adjusting jacket 2 and the metal plate 8b, between the metal plate 8a and the aluminum nitride plate 6, and between the aluminum nitride plate 6 and the dielectric member 4 are all performed by brazing, and accordingly, it is possible to more positively relieve the effect of a thermal stress due to a temperature change of the wafer stage 1 by adjusting the liner thermal expansion coefficient of the brazing material at a value between the linear thermal expansion coefficients of aluminum nitride and molybdenum or at a value close to these linear thermal expansion coefficients. In particular, since the joint between the temperature adjusting jacket 2 and the metal plate 8b, that is, between the temperature adjusting jacket 2 and the electrostatic chuck 3 is formed of only the brazing layer, it is possible to readily transfer a heating or cooling energy from the temperature adjusting jacket 2 to the electrostatic chuck 3, and hence to enhance the temperature-controllability of the wafer W.

Additionally, the side edges of electrode 5 are covered with the cylindrical portion 4a of the dielectric member 4 and also it is isolated from the pusher-pins by the cylindrical portions 4c between the upper surface of the aluminum nitride plate 6 and the dielectric member 4, and consequently, when the wafer stage 1 is used for a plasma process using a plasma system, it is possible to prevent occurrence of a leak current at the electrode 5 due to plasma.

While the preferred embodiment of the present invention has been described using specific terms, such description is for illustrative purposes only, and it is to be understood that changes and variations may be made without departing from the spirit or scope of the following claims.

For example, in the above-described embodiment, description has been made of the case in which the wafer W is set at a high temperature of 400° C. or more; however, the wafer stage 1 of the present invention can be of course used for other cases in which the wafer W is set at a high temperature less than 400° C., ordinary temperature, and low temperature.

What is claimed is:

1. A wafer stage including an electrostatic chuck and a temperature adjusting jacket disposed on the underside of said electrostatic chuck, said electrostatic chuck comprising:
    a dielectric member made from an insulating material,
    an electrode formed of a brazing layer, which is disposed on the underside of said dielectric member for fixing said dielectric member,
    an aluminum nitride plate disposed on the underside of said electrode, to which said dielectric member is fixed through said electrode,
    a heater, disposed on the underside of said aluminum nitride plate, for heating said dielectric member, and
    a metal plate disposed on the underside of said aluminum nitride plate and also at least on a top or bottom side of said heater, said temperature adjusting jacket being made from a composite aluminum based material prepared by treatment of aluminum or an aluminum alloy with inorganic fibers under a high pressure, said temperature adjusting jacket including a temperature adjusting means.

2. A wafer stage according to claim 1, wherein said electrostatic chuck is integrally joined to said temperature adjusting jacket through a brazing layer.

* * * * *